United States Patent [19]

Fruhling et al.

[11] Patent Number: 6,048,011
[45] Date of Patent: Apr. 11, 2000

[54] APPARATUS FOR CONTACTLESS CAPTURING AND HANDLING OF SPHERICAL-SHAPED OBJECTS

[75] Inventors: Dirk Fruhling, Wylie, Tex.; Takashi Kanatake, Tokorozawa; Bei Chen, Nagareyama, both of Japan

[73] Assignee: Ball Semiconductor, Inc., Allen, Tex.

[21] Appl. No.: 09/162,616

[22] Filed: Sep. 29, 1998

Related U.S. Application Data

[60] Provisional application No. 60/092,398, Jul. 10, 1998.

[51] Int. Cl.[7] .................................................... B25J 15/06
[52] U.S. Cl. ................................................................ 294/64.3
[58] Field of Search ................................ 294/64.1–64.3; 414/935, 941; 29/758, 743

[56] References Cited

U.S. PATENT DOCUMENTS

| | | | |
|---|---|---|---|
| 998,762 | 7/1911 | Paller | 366/11 |
| 2,310,265 | 2/1943 | Sweeny | 406/194 |
| 2,812,061 | 11/1957 | Pfister | 294/64.1 |
| 3,219,380 | 11/1965 | Carliss | 294/64.2 |
| 4,071,272 | 1/1978 | Drdlik | 294/64.1 |
| 4,378,209 | 3/1983 | Berge et al. . | |
| 4,735,449 | 4/1988 | Kuma | 294/64.3 |
| 4,969,676 | 11/1990 | LaMagna | 294/64.3 |
| 5,067,762 | 11/1991 | Akashi | 294/64.3 |
| 5,169,196 | 12/1992 | Safabakhsh | 294/64.3 |
| 5,955,776 | 9/1999 | Ishikawa | 257/618 |

FOREIGN PATENT DOCUMENTS 2524916  12/1976  Germany ............................. 294/64.3

OTHER PUBLICATIONS

Aerodynamic Levitation Technique for Containerless High Temperature Studies on Liquid and Solid Samples, David A. Winborne, et al., Metallurgical Transanctions B, vol. 7B, Dec. 1976.

*Primary Examiner*—Dean J. Kramer
*Assistant Examiner*—Paul T. Chin
*Attorney, Agent, or Firm*—Haynes & Boone LLP

[57] ABSTRACT

Apparatus and method for contactless capturing and transporting a restrained spherical-shaped semiconductor integrated circuit located within a transport tube or other component of a spherical-shaped semiconductor integrated circuit manufacturing system and restrained by a fluid flow within the transport tube or other component of the spherical-shaped semiconductor integrated circuit manufacturing system. The apparatus includes a diverging nozzle having an inlet aperture, an outlet aperture formed on an exterior side surface thereof and an interior sidewall which defines a generally frusto-conical shaped interior passageway through which gas flows. By repositioning the apparatus from a first position to a second position above, below or to one side of the first position, the restrained spherical object may be captured at an equilibrium position relative to the diverging nozzle. At the equilibrium position, the atmospheric pressure exerted on a first portion of the generally spherical object located outside the diverging nozzle is equal to an opposing pressure exerted on a second portion of the generally spherical object located within the generally frusto-conical interior passageway of the diverging nozzle by the flow of gas therethrough. Once the generally spherical object has been captured, the apparatus may be relocated to transport the device and the generally spherical object to a destination. During the transportation process, the generally spherical object will remain in the equilibrium position. The captured generally spherical object may then be released by increasing the rate of the flow of gas through the diverging nozzle until the generally spherical object is driven from the equilibrium position.

16 Claims, 2 Drawing Sheets

APPARATUS FOR CONTACTLESS CAPTURING AND HANDLING OF SPHERICAL-SHAPED OBJECTS

CROSS REFERENCE

This application claims the benefit of U.S. Provisional Application No. 60/092,398, filed Jul. 10, 1998.

BACKGROUND OF THE INVENTION

The invention relates generally to spherical-shaped semiconductor integrated circuit manufacturing and transportation processes, and more particularly, to an apparatus for contactless capturing and handling of spherical-shaped objects which is suitable for use in the manufacture and transport of spherical-shaped semiconductor integrated circuits.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modem fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional flat chips. Furthermore, the chips must bear a high price to cover the costs of manufacturing, as well as the return on initial capital and investment.

In U.S. patent application, Ser. No. 08/858,004 filed on May 16, 1997, now U.S. Pat. No. 5,955,776 issued Sep. 21, 1999, assigned to the same assignee as the present application and hereby incorporated by reference as if reproduced in its entirety, a method and apparatus for manufacturing spherical-shaped semiconductor integrated circuits is disclosed. As disclosed in the aforementioned patent application, the manufacturing process by which a spherical-shaped semiconductor integrated circuit is produced may include a variety of processing steps. Among these are: de-ionized water cleaning, developing and wet etching; diffusion, oxidation and deposition of films; coating; exposure; plasma etching, sputtering and ion implantation; ashing; and epitaxial growth.

Complicating the manufacturing process for spherical-shaped semiconductor integrated circuits are the special handling requirements which must be afforded the circuits during the manufacture thereof. Unlike conventional integrated circuits formed from flat surface semiconductor wafers, the spherical-shaped semiconductor integrated circuits produced from spherical-shaped semiconductors consume the entire surface area of the spherical-shaped semiconductors. Thus, unlike conventional integrated circuits which may be grasped along bottom or side surfaces thereof, grasping or otherwise contacting spherical-shaped semiconductor during the manufacturing process may result in significant damage thereto. Thus, many of the processing techniques used to manufacture conventional integrated circuits are unsuitable for use in the manufacture of spherical-shaped semiconductor integrated circuits.

Thus, the difficulties associated with the handling and transport of spherical-shaped semiconductor integrated circuits during the manufacturing process remains an obstacle to the development of such devices. Much of the attention in solving this problem has focussed, however, on how to transport spherical-shaped semiconductors between adjacent process stations in a spherical-shaped semiconductor integrated circuit manufacturing system. Typically, such manufacturing systems include one or more transport tubes specially designed to carry spherical-shaped semiconductors between process stations while preventing the spherical-shaped semiconductors from contacting the sidewalls of the tubes, typically using flow control techniques such as those disclosed in co-pending U.S. patent application Ser. No. 08/858,004, now U.S. Pat. No. 5,955,776, and previously incorporated by reference into the present application.

Such transport tubes are typically sealed systems for transporting large volumes of spherical-shaped semiconductors between process stations. Thus, there remains a need, however, for a device capable of contactless capturing, holding and transporting of spherical-shaped semiconductors. Such a device would be particularly useful if configured as a hand-held device. For example, such a device could be used to remove selected spherical-shaped semiconductors from a spherical-shaped semiconductor integrated circuit manufacturing process for examination, testing or manual transport between processing stations. In the past, either mechanical tweezers or various types of vacuum devices were used to capture and transport spherical-shaped semiconductors. However, these devices all relied upon physical contact to capture the spherical-shaped semiconductors. As a result, the surface of the spherical-shaped semiconductors were often damaged during capture and transport operations.

While the levitation of spherical-shaped objects has been disclosed, such levitation devices are not particularly well suited for performing capture and transport operations. For example, U.S. Pat. No. 4,378,209 to Berge et al. discloses a gas levitator capable of levitating a specimen of material in a containerless environment. The levitator disclosed in Berge et al. is, however, characterized by an elongated downstream section which renders it difficult, if not impossible to use Berge et al. outside of the disclosed use as a processing station for the levitated specimen.

Thus, there remains a need for a device capable of readily capturing, holding and transporting spherical-shaped objects, particularly, if the device is capable of being operated as a stand-alone and/or hand-held tool. It is, therefore, the object of the invention to provide such a tool.

SUMMARY OF THE INVENTION

In one embodiment, the present invention is of an apparatus for contactless capture of spherical objects which includes a diverging nozzle having inlet and outlet ends and means for providing a flow of gas therethrough. Spherical objects captured by the apparatus are held in an equilibrium position where atmospheric pressure exerted on a first portion of the spherical object positioned outside of the diverging nozzle is generally equal to an opposing pressure exerted on a second portion of the spherical nozzle positioned within the diverging nozzle by the flow of gas therethrough.

In another embodiment, the present invention is of an apparatus for contactless capture of spherical objects which includes a diverging nozzle having, from inlet to outlet ends thereof, an angle of divergence of about 45 degrees and means for providing a flow of gas which enters the at the inlet end and exits at the outlet end of the diverging nozzle. The inlet end has a generally circular cross-section, the ratio of the diameter thereof to the diameter of spherical objects captureable by the apparatus being about 1:5.

In still another embodiment, the present invention is of a hand-held apparatus for contactless capture of spherical objects which includes a compressed gas cylinder and a nozzle. The nozzle has an inlet aperture formed in a first side thereof and coupled to an outlet aperture of the compressed gas cylinder, an outlet aperture formed in a second side thereof, and an interior sidewall which defines a passageway extending therebetween. The passageway of the nozzle includes a diverging section which extends from a first location along the interior sidewall to the outlet aperture formed in the second side of the nozzle. The cross-sectional area of the interior passageway at the first location is less than the cross-sectional area of the interior passageway at the outlet aperture. In one aspect thereof, the diverging section has a generally frusto-conical shape with the cross-sectional area at the first location forming a frustum therefor. In another, the diverging section has an angle of divergence of about 45 degrees relative to a central axis thereof while, in still another, the diameter of the diverging section is about 0.2 mm at the first location and about 1.1 mm at the outlet aperture.

In still other aspects thereof, the apparatus may further include a first flow control valve coupled between the outlet aperture of the compressed gas cylinder and the inlet aperture of the nozzle, either alone or in combination with a second flow control valve coupled to an inlet aperture of the compressed gas cylinder. The first flow control valve controls flow rate of compressed gas entering the nozzle which, for example, may flow at a rate of about 0.2 liters/minute. The second flow control valve controls the supply and resupply of compressed gas to the compressed gas cylinder.

BRIEF DESCRIPTION OF THE DRAWINGS

FIG. 2b is a first enlarged cross-sectional view of a portion of the tip section of FIG. 2a.

FIG. 2c is a second, simplified, enlarged cross-section view of a portion of the tip section of FIG. 2a.

DESCRIPTION OF THE EMBODIMENTS

Figure 1:
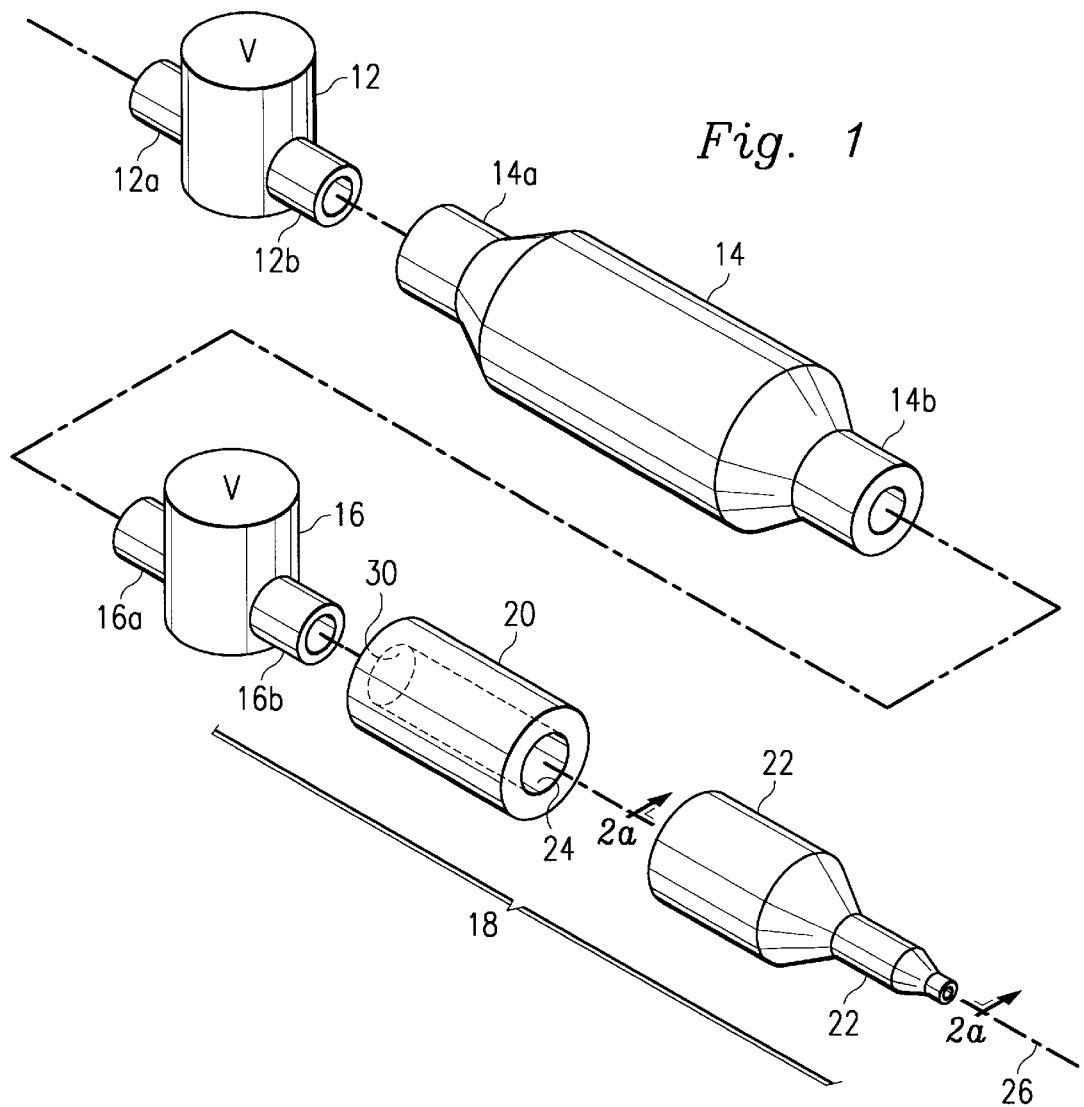
FIG. 1 is an exploded perspective view of an apparatus, constructed in accordance with the teachings of the present invention, for contactless capturing and handling of spherical-shaped objects.

Referring to FIG. 1, the reference numeral 10 refers, in general, to a hand-held device, constructed in accordance with the teachings of the present invention, for contactless capturing and holding of spherical-shaped objects. As will be more fully described below, the device 10 captures and holds a spherical-shaped object using positive pressure, specifically, by securing the spherical-shaped object in an equilibrium position where air pressure resulting from directing a high velocity flow of at the spherical object is at equilibrium with atmospheric pressure exerted on the object. As a positive pressure flow of gas is used to capture and hold spherical-shaped objects, the spherical-shaped objects may be picked up without any damage to the surface of the spherical-shaped object which typically occurs if the spherical-shaped object should contact the device.

It is contemplated that the device 10 be used to capture and hold spherical-shaped objects such as spherical-shaped semiconductor integrated circuits in place without contact between the device 10 and the captured object. Once captured, the spherical-shaped object may be transported to a selected location and then released by increasing the flow rate of gas exiting the diverging nozzle until the spherical-shaped object is forced out of the equilibrium position. For example, the device 10 may be used to transport spherical-shaped semiconductors between process stations forming part of a spherical-shaped semiconductor integrated circuit manufacturing facility. In another application, the device 10 may be used to remove spherical-shaped semiconductors from the process stations and/or transport tubes of the manufacturing process for examination, for example, as part of a quality control program. In the embodiment of the invention disclosed herein, the spherical-shaped object catching device is configured as a portable, manually operated hand-held device. It should be clearly understood, however, that, in an alternate embodiment of the invention, the device 10 may be configured as an automated device which captures, transports and releases spherical-shaped objects in response to control signals issued by a control system coupled thereto.

The device 10 includes a first flow control valve 12 such as a check valve, a compressed gas cylinder 14, a second flow control valve 16 and a nozzle assembly 18 comprised of a nozzle holder 20 and a diverging nozzle 22. The compressed gas cylinder 14, which is typically rated to 1800 p.s.i., holds a supply of a compressed gas, for example, air, which is used to generate a positive pressure gas flow capable of capturing spherical-shaped objects. Of course, other inert gases, for example, nitrogen or argon, may be used in place of air. The compressed gas cylinder 14 includes an interior chamber (not shown) having an inlet end 14a coupled to an outlet end 12b of the first flow control valve 12 and an outlet end 14b coupled to an inlet end 16a of the second flow control valve 16. Supply and delivery of compressed gas to and from the compressed gas cylinder 14 are controlled by the first and second flow control valves 12 and 16, respectively. To fill the interior chamber of the cylinder 14, the second control valve 16 is first closed. An inlet end 12a of the first flow control valve is then coupled to a supply of compressed gas, for example, a larger cylinder of compressed gas or a compressed gas distribution system. The first flow control valve 12 is then opened, for example, by toggling a switch (not shown) thereof, to allow compressed gas to flow from the compressed gas supply, through the first control valve 12 and into the interior chamber of the compressed gas cylinder 14. When the interior chamber is filled, the first flow control valve 12 is then closed and the supply of compressed gas decoupled from the inlet end 12a thereof. The device 10 is now ready for use.

To operate the device 10, the second flow control valve 16 is opened, for example, by rotating a dial (not shown) or other flow control means to gradually open the second flow control valve 16, thereby enabling a stream of gas to begin to flow through the nozzle assembly 18. While the flow rate of the gas passing through the nozzle assembly 18 may be varied, it has been discovered that a flow rate of 0.2 liters/minute has proven suitable for the purposes disclosed herein. Of course, suitable flow rates for gas traveling through the nozzle assembly 18 may vary depending on any number of factors such as dimensions of the nozzle assembly 18 or weight of the spherical-shaped objects to be captured by the device 10.

As may be further seen in FIG. 1, the nozzle assembly 18 is comprised of the nozzle holder 20 and the diverging nozzle 22. The body of the nozzle assembly 18, including both the nozzle holder 20 and the diverging nozzle 22 are formed of metal or another durable material capable of withstanding flows of gas at high velocities. The nozzle holder 20 is coupled to the outlet end 16b of the second flow control valve 16 while the diverging nozzle 22 is securely coupled to the nozzle holder 20. For example, the diverging nozzle 22 could be slid over the nozzle holder 20 such that an interior side surface of the diverging nozzle 22 securely engages an exterior side surface of the nozzle holder 20. It should be clearly understood, however, that the disclosed configuration of the nozzle assembly 18 is purely exemplary and that the various other configurations are suitable for use.

Figure 2A:
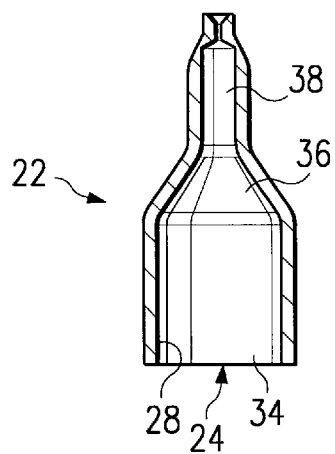
FIG. 2a is a cross-sectional view, taken along lines 2a—2a of FIG. 1, of a tip section of the apparatus of FIG. 1.
Figure 2B:
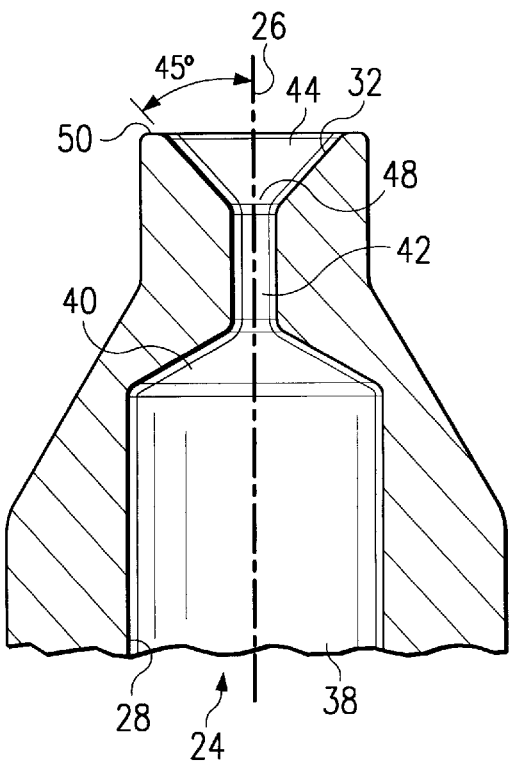
Figure 2C:
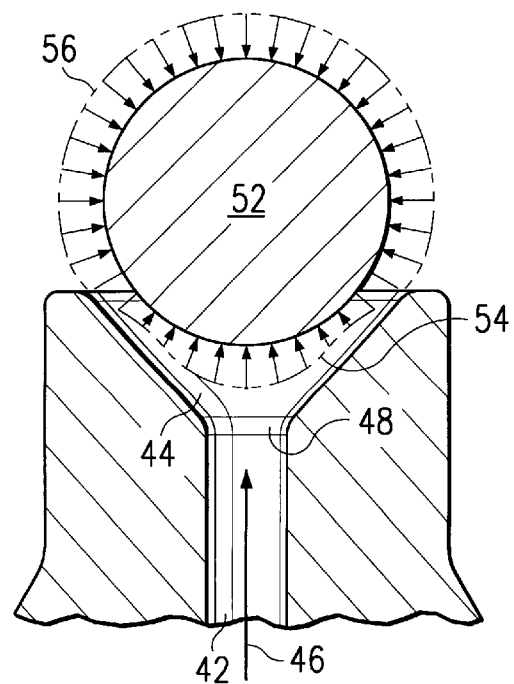

Referring next to FIGS. 2a–c, the configuration of the diverging nozzle 22 will now described in greater detail. Extending through the interior of the nozzle holder 20 and the diverging nozzle 22 is an interior passageway 24. While having different diameters along various portions thereof, the interior passageway 24 is generally centered along axis 26. The interior passageway 24 extends from an inlet aperture 30 (shown in phantom in FIG. 1) to an outlet aperture 32 and is defined by an interior sidewall 28. The interior passageway 24 includes a first, generally cylindrical section 34, a first converging section 36, a second, generally cylindrical section 38, a second converging section 40, a third, generally cylindrical section 42 and a diverging section 44.

As the spherical-shaped objects to be captured and held by the device 10 are relatively small, typically, on the order of about 1 mm in diameter, it is contemplated that the device 10 should be easy to handle when positioning tip 22a of the nozzle 22 relative to a spherical-shaped object to be captured thereby. It is further contemplated that the device should be configured to eject, from the tip 22a of the nozzle 22, a narrow stream of gas traveling at a relatively high speed. To achieve the desired stream of gas exiting the tip 22a of the nozzle 22, the interior passageway 24 includes the first and second converging section 36 and 40, each of which narrows the width of the stream while increasing the velocity thereof. By providing a generally cylindrical section 38 between the first and second converging sections 36 and 40, the projecting tip 22a is lengthened to enhance the overall handling capabilities of the device 10.

As the stream of gas flows through the interior passageway 24, it passes through, in sequence, the first cylindrical section 34, the first converging section 36 (where the stream is narrowed in diameter while the velocity thereof is increased), the second cylindrical section 38, the second converging section 40 (where the stream is again narrowed in diameter and the velocity thereof is again increased), the third cylindrical section 42 and the diverging section 44 (where the velocity of the flow decreases while the pressure of the flow increases). The diverging section 44 of the interior passageway 24 extends from an inlet aperture formed at interior line 48 to an outlet aperture formed in exterior side surface 50 of the nozzle 22. Both the inlet and outlet apertures are generally circular in shape, the outlet aperture having a cross-sectional area which is larger than the cross-sectional area of the inlet aperture. Preferably, the interior sidewalls 28 forming the passageway 24 should be tapered in the vicinity of the inlet and outlet apertures of the diverging section 44 so that turbulence within the gas stream as it enters and exits the diverging section 44 will be minimized.

As may be seen in FIGS. 2b–c, the diverging section 44 of the interior passageway 24 is formed in a frusto-conical shape in which the inlet aperture formed at the interior line 48 forms a frustum thereof. While it is specifically contemplated that the diverging section 44 may be variously dimensioned, the diverging section 44, if sized such that the diameter of the inlet aperture is 0.2 mm., the sidewall 28 which defines the diverging section 44 has an angle of divergence of 45 degrees relative to the central axis 26, and the outlet aperture has a diameter of 1.1 mm., is particularly well suited for the purposes contemplated herein. The aforementioned angle of divergence may be varied as much as 5 degrees without noticeable effect on the operation of the device 10.

Of the various sections of the interior passageway 24, it is specifically contemplated that only the diverging section 44 is essential to the practice of the present invention while the remaining sections are primarily for producing a narrow stream of gas having a suitably high velocity. Thus, it is specifically contemplated that the invention is equally suitable for the uses contemplated herein if the nozzle 22 was shaped to only include the diverging section 44 of the interior passageway 24. In this embodiment of the invention, it is further contemplated that the inlet aperture for the diverging section 44 would be formed along an exterior side surface of the nozzle 22 and that the aforementioned inlet aperture would be coupled to a gas supply capable of providing a suitably narrow, high velocity stream of gas.

Referring now to FIG. 2c, the process by which the device 10 captures and holds spherical-shaped objects, for example, the spherical-shaped semiconductor 52, will now be described in greater detail. Initially, the spherical-shaped semiconductor 52 is restrained in place. For example, the spherical-shaped semiconductor 52 may be suspended within a process flow generated within a transport tube or process station of a spherical-shaped semiconductor integrated circuit manufacturing facility. The second control valve 16 is then opened to begin a flow of a stream of gas through the nozzle 22. Typically, the second control valve 16 will be adjusted such that the flow rate is about 0.2 liters/ minute. As the stream of gas flowing through the third cylindrical section 42 enters the diverging section 44, the stream will decrease in velocity and increase in pressure. As the tip 22a of the nozzle 22 is moved towards the spherical-shaped semiconductor 52, the stream of gas flowing through the diverging nozzle 44 begins to exert pressure on the spherical-shaped semiconductor 52, herein characterized as "positive" pressure, as the pressure tends to urge the spherical-shaped semiconductor 52 away from the diverging nozzle 44. Of course, the amount of pressure exerted on the spherical-shaped semiconductor 52 will tend to vary, depending on the proximity of the diverging nozzle 44 and the velocity of the stream of gas flowing therethrough. An exemplary pressure profile 54 exerted on a first portion of the spherical-shaped semiconductor 52 positioned within the diverging nozzle 44 by the stream of gas flowing through the diverging nozzle 44 is shown in FIG. 2c. Opposing the pressure profile 54 is a second pressure profile 56 exerted on a second portion of the spherical-shaped semiconductor 52 positioned outside of the diverging nozzle 44 by atmospheric pressure. As the tip 22a is moved towards the spherical-shaped semiconductor 52, the pressure profile 54 increases (thereby increasing the tendency to urge the spherical-shaped semiconductor 52 against the restraining forces and away from the diverging nozzle 44 which, in turn, would tend to reduce the pressure profile 54).

In the absence of further movement of the diverging nozzle 44, these opposing forces drives the spherical-shaped semiconductor 52 into an equilibrium position whereby the pressure profiles 54 and 56 are generally equal and opposite to each other. In fact, the spherical-shaped semiconductor 52 will be driven into the equilibrium position regardless of the particular direction from which the tip 22a is moved into proximity with the spherical-shaped semiconductor. At this point, the spherical-shaped semiconductor 52 has been caught in that it will remain in the equilibrium position. For example, if the flow rate of the stream gas is increased or the tip 22a is moved closer to the spherical-shaped semiconductor 52, two changes which will both increase the pressure exerted by the stream of gas exiting the diverging nozzle 44, the spherical-shaped semiconductor 52 will move away from the diverging nozzle 44 until the pressure profiles 54 and 56 again equalize. In this manner, the spherical-shaped semiconductor 52 will avoid contact with the diverging nozzle 44 of the device 10, thereby avoiding any damage to the surface which may result from such contact therebetween. Once captured in the equilibrium position, the spherical-shaped semiconductor 52 may be easily transported to another location by simply moving the device 10 to the desired location. Again, as the spherical-shaped semiconductor 52 will adjust to any movement of the diverging nozzle 44 such that the spherical-shaped semiconductor 52 will continuously remain in the equilibrium position, contact between the two will be avoided while the spherical-shaped semiconductor is being transported to the desired location. Once the spherical-shaped semiconductor 52 has been transported to the desired location, it may be released by quickly increasing the flow of gas through the diverging nozzle 44 so that the spherical-shaped semiconductor 52 is driven out of the equilibrium position.

While specific dimensions of the diverging nozzle 44 have been provided herein, it should be clearly understood that the dimensions are scalable. Thus, similarly configured devices 10 may be used to capture and hold spherical-shaped objects having a wide variety of dimensions by proportionately adjusting the dimensions of the diverging nozzle 44. For a diverging nozzle 44 dimensioned as disclosed herein, the resultant device would be particularly well suited for the capture and transport of spherical-shaped objects having a diameter of 1 mm. (about 5 times the diameter of the inlet aperture of the diverging nozzle 44. It has been further discovered that the disclosed apparatus may be used to capture spherical-shaped objects constructed of a variety of materials, including chromium and silicon nitride, having specific gravities which range between 2.3 and 5.

Thus, there has been described and illustrated herein, a device capable of capturing, holding and transporting spherical-shaped objects without allowing contact between the device and object to occur. It should be clearly understood, however, that various modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for contactless capture of spherical objects, comprising:
   a diverging nozzle having an inlet end, an outlet end and an angle of divergence of about 45 degrees; and
   means for providing a flow of gas through said diverging nozzle, said flow of gas entering said diverging nozzle at said inlet end and exiting said diverging nozzle at said outlet end;
   said inlet end having a generally circular cross-section;
   wherein the ratio of the diameter of said inlet end to the diameter of spherical objects captureable by said apparatus is about 1:5 and wherein a spherical object captured by said apparatus is held in an equilibrium position where atmospheric pressure exerted on a first portion of said spherical object positioned outside said diverging nozzle is generally equal to an opposing pressure exerted on a second portion of said spherical object positioned within said diverging nozzle by said flow of gas through said diverging nozzle.

2. The apparatus of claim 1 wherein said diverging nozzle further comprises an interior sidewall which defines an interior passageway having a generally frusto-conical shape.

3. The apparatus of claim 1 wherein said diverging nozzle further comprises an interior sidewall which defines an interior passageway which extends from said inlet end to said outlet end and wherein the diameter of said interior passageway of said diverging nozzle at said inlet end is about 0.2 mm and the diameter of said interior passageway of said diverging nozzle at said outlet end is about 1.1 mm.

4. The apparatus of claim 1 wherein said means for providing a flow of gas through said diverging nozzle further comprises:
   a compressed gas cylinder having an outlet aperture from which gas may flow
   said outlet aperture of said compressed gas cylinder coupled to said inlet end of said diverging nozzle;

wherein gas flowing out of said outlet aperture of said compressed gas cylinder enters said diverging nozzle at said inlet end and exits said diverging nozzle at said outlet end to provide said flow of gas through said diverging nozzle.

5. The apparatus of claim 4 and further comprising:

a first flow control valve coupled between said outlet aperture of said compressed gas cylinder and said inlet end of said diverging nozzle;

said first flow control valve controlling flow rate of compressed gas entering said nozzle.

6. The apparatus of claim 5 and further comprising:

a second flow control valve coupled to an inlet aperture of said compressed gas cylinder;

said second flow control valve controlling supply and resupply of compressed gas to said compressed gas cylinder.

7. A hand-held apparatus for contactless capture of spherical objects, comprising:

a compressed gas cylinder having an outlet aperture from which gas may flow;

a nozzle having first and second sides, an inlet aperture formed in said first side, an outlet aperture formed in said second side and an interior sidewall which defines a passageway extending between said inlet and outlet apertures;

said nozzle coupled to said compressed gas cylinder such that said outlet aperture of said compressed gas cylinder is in communication with said inlet aperture of said nozzle;

said passageway having a first, non-diverging, section which extends from said inlet aperture formed in said first side of said nozzle to a first location alone said interior sidewall and a second, diverging, section which extends from said first location along said interior sidewall to said outlet aperture formed in said second side of said nozzle;

said passageway having a first cross-sectional area at said first location and a second cross-sectional area, greater than said first cross-sectional area, at said outlet aperture;

wherein a spherical object captured by said hand-held apparatus is held in an equilibrium position where atmospheric pressure exerted on a first portion of said spherical object positioned outside said nozzle is generally equal to an opposing pressure exerted on a second portion of said spherical object positioned within said nozzle by said flow of gas through said nozzle.

8. The apparatus of claim 7 wherein said diverging passageway of said passageway has a generally frusto-conical shape with said first cross-sectional area at said first location forming a frustum of said generally frusto-conical shape.

9. The apparatus of claim 8 and further comprising:

a first flow control valve coupled between said outlet aperture of said compressed gas cylinder and said inlet aperture of said nozzle;

said first flow control valve controlling flow rate of compressed gas entering said nozzle.

10. The apparatus of claim 9 and further comprising:

a second flow control valve coupled to an inlet aperture of said compressed gas cylinder;

said second flow control valve controlling supply and resupply of compressed gas to said compressed gas cylinder.

11. The apparatus of claim 8 wherein compressed gas enters said nozzle at a flow rate of about 0.2 liters/minute.

12. The apparatus of claim 8 wherein said non-diverging section of said passageway further comprises:

a first, generally cylindrical, portion and a second, converging, portion;

wherein said second, converging, portion of said non-diverging section increases the velocity of said flow of gas.

13. The apparatus of claim 8 wherein said non-diverging section further comprises:

a third, generally cylindrical, portion and a fourth, converging, portion;

wherein said third, generally cylindrical, portion of said non-diverging section enhances handling capabilities of said apparatus by lengthening said nozzle and said fourth, converging, portion of said non-diverging section further increases the velocity of said flow of gas.

14. The apparatus of claim 13 wherein said third, generally cylindrical portion of said non-diverging section is located between said second, converging, portion and said fourth, converging, portion of said non-diverging section.

15. The apparatus of claim 7 wherein a portion of said interior sidewall which defines said diverging passageway of said interior passageway has an angle of divergence of about 45 degrees relative to a central axis of said diverging section.

16. The apparatus of claim 7 wherein the diameter of said passageway at said first location is about 0.2 mm and the diameter of said passageway at said outlet aperture is about 1.1 mm.

* * * * *